United States Patent [19]

Strothers et al.

[11] Patent Number: 5,143,590
[45] Date of Patent: Sep. 1, 1992

[54] METHOD OF MANUFACTURING SPUTTERING TARGET ASSEMBLY

[75] Inventors: Susan D. Strothers, Spokane; Robert G. Delano, Valleyford; Garold L. Steed, Spokane, all of Wash.

[73] Assignee: Johnson Matthey Inc., Valley Forge, Pa.

[21] Appl. No.: 728,249

[22] Filed: Jul. 10, 1991

[51] Int. Cl.⁵ .................. C23C 14/34; B23K 15/00
[52] U.S. Cl. .................. 204/298.12; 204/192.12; 219/121.14
[58] Field of Search ............ 204/192.12, 298.12, 204/298.09; 219/121.14

[56] References Cited

U.S. PATENT DOCUMENTS 4,290,876 9/1981 Nishiyama et al. ........ 204/298.12 X
4,341,816 7/1982 Lauterbach et al. ....... 204/298.12 X
4,885,075 12/1989 Hillman .................... 204/298.12 X
5,009,765 4/1991 Qamar et al. ............. 204/298.12

Primary Examiner—Nam Nguyen
Attorney, Agent, or Firm—Christie, Parker & Hale

[57] ABSTRACT

Described is a method of manufacturing a sputtering target assembly is that minimizes distortion during manufacture and a novel target assembly so produced. The method involves positioning a backing member in an external shoulder formed in the target member, electron beam welding mating surfaces and machining the interior surface of the welded assembly to provide a coextensive surface along the inner surfaces of the target and backing members. The resulting target assembly can withstand high water pressure and high sputter power levels.

9 Claims, 2 Drawing Sheets

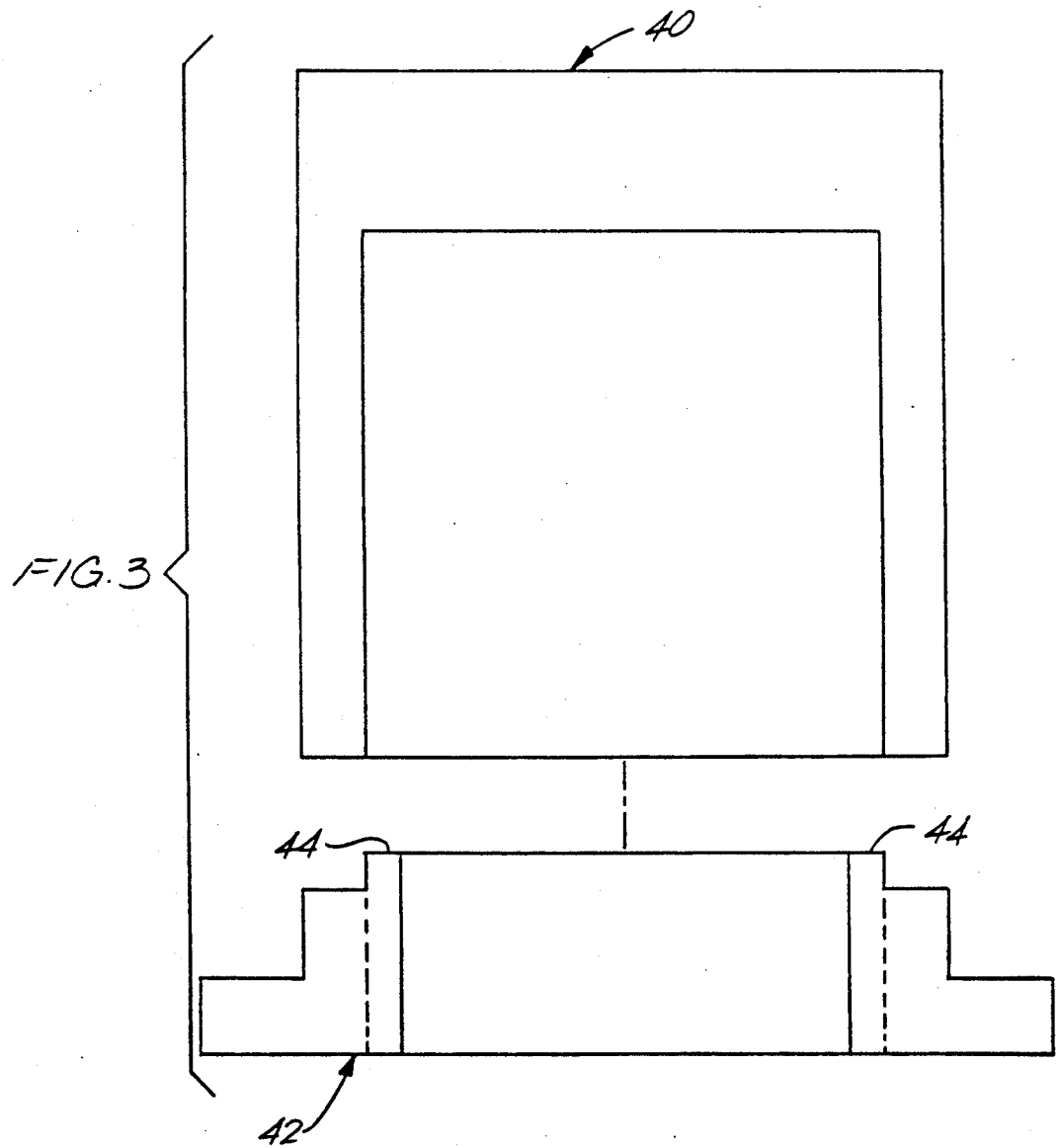

METHOD OF MANUFACTURING SPUTTERING TARGET ASSEMBLY

BACKGROUND OF THE INVENTION

It is well known that thin metallic and ceramic layers may be deposited upon a substrate by a technique known as "magnetron sputtering". By such methods, a metal layer may be sputtered in an argon atmosphere using a target of the material to be deposited, generally as a cathode in a standard RF sputtering apparatus.

More recently, sputtering techniques have been used in the production of integrated circuits which require rapid and economical metal deposition with very close tolerances. Sputtering is an especially useful tool for the application of films and coatings where uniformity and chemical purity is important. Manufacturing costs may be lowered by improving film uniformity and deposition rate in high speed production processes typically used in integrated circuit manufacturing. Materials of particular importance in the manufacture of integrated circuits are aluminum and aluminum alloys. Targets of aluminum and/or aluminum alloys are used for sputtering to produce an aluminum film or coating on a substrate.

Sputtering processes and apparatus are disclosed in Bergmann et al. U.S. Pat. No. 4,889,772 and 4,961,831; Shagun et al., U.S. Pat. No. 4,961,832; Shimamura et al., U.S. Pat. No. 4,963,239; Nobutani et al., U.S. Pat. No. 4,964,962; Arita, U.S. Pat. No. 4,964,968; Kusakabe et al., U.S. Pat. No. 4,964,969 and Hata, U.S. Pat. No. 4,971,674; and the references referred to therein; sputtering targets are discussed also in Fukasawa et al., U.S. Pat. No. 4,963,240 and 4,966,676; and Archut et al., U.S. Pat. No. 4,966,677. These disclosures of sputtering processes and apparatus as well as sputtering targets are expressly incorporated herein by reference.

Sputtering target assemblies are typically constructed with a target member supported on a backing member. The target member includes a target surface of material to be sputtered and the backing member is intended to hold the target member in place in a sputtering apparatus. Targets must be replaced from time-to-time as the target material is removed or eroded away. For some target designs, it is necessary to replace both the target member and the backing member when the need to replace the target arises.

Some proposals have been made to reduce the time required to replace a sputtered target and to reduce the cost of target replacement. One such proposal is by Fielder et al. which is described in U.S. Pat. No. 4,820,397. This approach involves a particular target assembly design; however this design appears that is difficult and expensive to manufacture.

Another problem which has arisen with respect to target assemblies is distortion which may occur during manufacture of the target assembly from the heat input into members being welded. Conventional methods of manufacturing target assemblies have included TIG welding, brazing, soldering with high temperature solder, and explosion-bonding of the target member to a backing assembly. These methods of bonding generally involve the use of a filler material.

A conventional target assembly design utilizes annular targets positioned within a fixed backing plate and typically retained in place by soldering or joining as described above. The sputtering targets are independently removable from the backing plates for replacement of targets. In general, however, where the sputtering target is physically joined to the backing plate, (i.e., by welding, roll cladding or explosive bonding), it is usually removable as a unit into and out of the sputtering system, thus requiring both the spent target and backing member to be discarded.

Annular targets are preferred to facilitate cooling and circulation of coolant to the target assembly. However, where the target and backing members are of dissimilar materials, problems can arise due to the materials different thermal expansion rates. The soldered joint can be adversely affected and result in premature failure of the target assemblies. Qamar et al. have disclosed in U.S. Pat. No. 5,009,765 an alternative method for interconnecting the target and backing members which is purported to have improved heat transfer capability. The method involves forming a recess at the interface of the target member and the backing member and filling the recess with suitable filler bonding material. The members are joined together by aluminum TIG welding at the recess. Unfortunately, conventional welding techniques are frequently accompanying by a large heat effected zone which can lead to distortion of the target assembly during manufacture. Moreover, such methods also require a high input of heat to the members being welded and the use of a filler material.

SUMMARY OF THE INVENTION

The present invention provides a method of manufacturing sputtering target assemblies. The new method reduces distortion of the assemblies during manufacture and results in a novel target assembly with superior properties.

According to the present invention, a sputtering target assembly is manufactured of a target member and a backing member. The method comprises providing a target member having a lateral target surface and a side wall with a lower end and inner and outer surfaces. A backing member is provided for the target member and the backing member has a side wall with a top surface and inner and outer surfaces. The top surface of the backing member is intended to engage the lower end of the target member which is provided with an inwardly and downwardly extending shoulder in the outer surface of the side wall at the lower end. The shoulder terminates in a lip extending to the inner surface. The top surface of the backing member is positioned within the shoulder of the target member so that the top surface is in surface-to-surface with the target member. The side wall with the backing member is sized with respect to the shoulder so that the side wall of the backing member is also in surface-to-surface contact with the lip in the outer surface of the side wall forming one side of the shoulder. The outer surface of the backing member is substantially coextensive with the outer surface of the side wall of the target member. Advantageously, the backing member is made to provide a snug fit when engaging the target member at the shoulder portion of the target member's side wall. After being fit together in the manner described, the target and backing members are firmly held together and the surface-to-surface contact areas are joined by electron beam welding. After welding, the inner surface of the side walls of the backing member and the lip of the target member are machined to remove the lip and provide a coextensive inner surface along the inner surfaces of the backing member and the target member.

The target assembly produced by the above described method can withstand high water pressure, i.e., as much as 60 psi, and high sputter power levels, i.e., greater than 12 kw.

BRIEF DESCRIPTION OF DRAWINGS

FIG. 3 is a schematic exploded view of another embodiment of a target assembly in accordance with the invention.

DESCRIPTION OF PREFERRED EMBODIMENT

Figure 1:
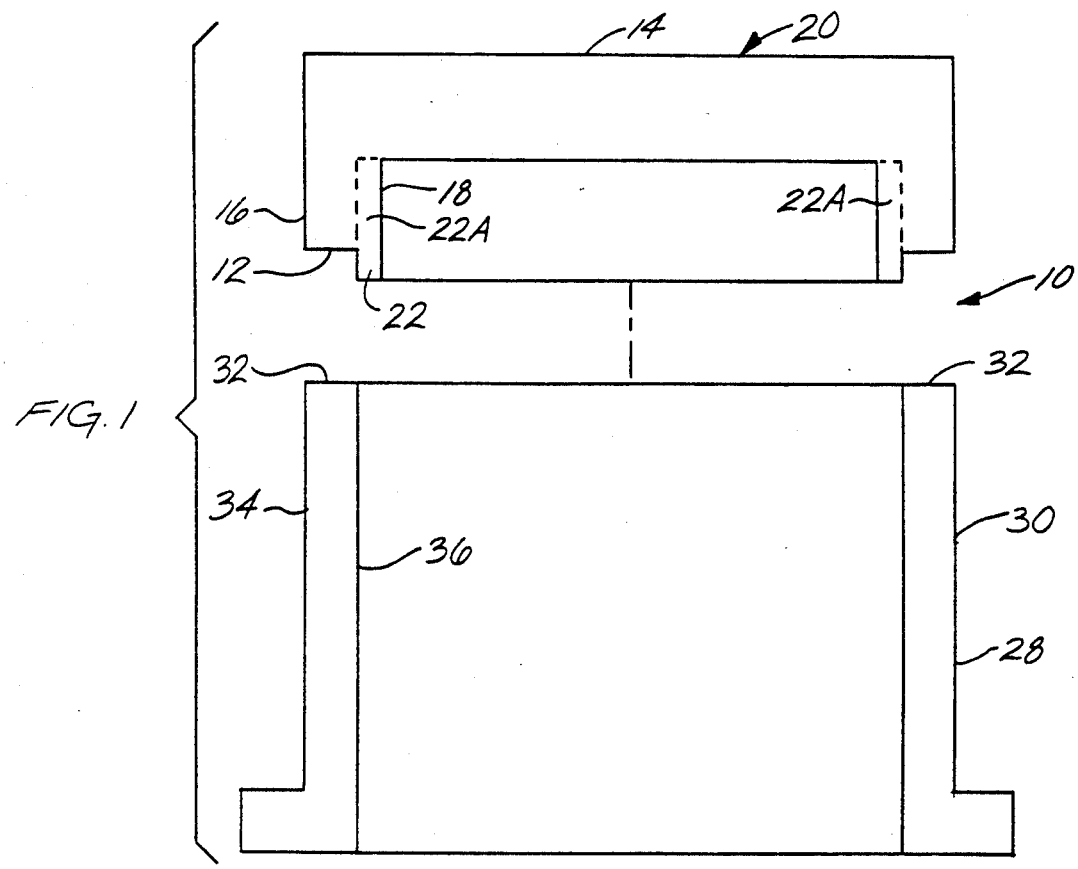
FIG. 1 is a schematic exploded view of the target assembly to be manufactured in accordance with the invention.
Figure 2:
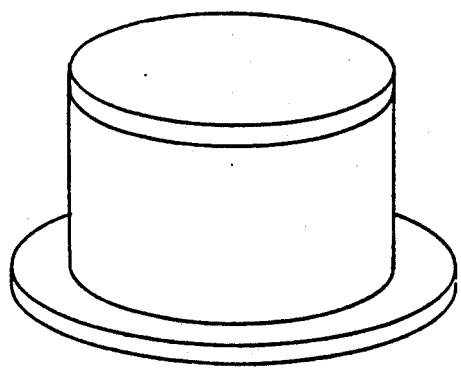
FIG. 2 is a prospective view of the finished target assembly manufactured in accordance with the invention.

As is seen in FIG. 1 the target assembly 10 to be manufactured comprises a target member 20 and a backing member 30. The target assembly is of a typical annular configuration such as may be employed in a suitable sputtering apparatus.

The target member 20 has a lateral, e.g. upper, target surface 14 formed of material to be sputtered, and outer and inner side walls 16 and 18, respectively. The target member is provided with an inwardly extending shoulder 12 in the outer surface of the side wall at the lower end of the target member. The shoulder terminates in a transverse or downwardly extending lip 22.

Backing member 30 is provided with side wall 28 having outer and inner surfaces 34 and 36, respectively, and a top surface 32. The side walls of the backing member are sized with respect to the shoulder on the target member so that the top surface 32 of the side wall may be positioned within the shoulder surface 12 and also abuts against lip 22; thus, end wall 28 is in surface-to-surface contact with the target member including the portions 12 and lip 22 thereof. Advantageously, the end wall is provided with close dimensions to cause a snug fit around the lip 22.

After fitting the side walls of the backing member into position within the shoulder, as described, the backing member and target are firmly held in position and the surface-to-surface contact areas are welded by electron beam welding. Following welding, the inner surfaces of the backing member and target member are machined so as to remove the lip portion 22A to the target and provide a coextensive inner surface along the inner surfaces of the backing member and the target member. Advantageously, the outer surface of the side walls of both the backing and target members is also machined to final tolerances to also produce a coextensive outer surface.

The use of the lip 22 in combination with electron beam welding of the target member and backing member are critical to manufacturing the target assembly with minimal distortion. The lip maintains the positioning of the backing member in contact with the target member during welding to minimize distortion during electron beam welding. Electron beam welding is also critical because it produces high quality welds with a narrow heat affected zone (HAZ). Furthermore, electron beam welding involves a low heat input into the members being welded and dispenses with the need of filler materials during joining.

Another embodiment of the invention is shown in FIG. 3. In this embodiment a "deep dish" design is provided which allows operators of the sputtering equipment to shorten the dark space shielding that surrounds the target. The sputtering portion of this design would be made by precision forging or impact extrusion and would be made out of the same high purity alloys as the previously described design. The backing member would be electron beam welded to the target and advantageously would be also machined out of 2000 series aluminum alloys such as 2014-T6 tubing or plate.

As shown in FIG. 3, the assembly comprises a target member 40 and a backing member 42 with a stepped flange configuration and lip 44 to be removed by machining after assembly. The method of manufacturing this design is the same as described in connection with the FIG. 1 design except that the machining of the outer surface is only necessary through the interface area between the backing member and the target member.

As a specific illustration of the invention, a sputtering targets of high purity aluminum (such as 1% Si, balance aluminum and 1% Si, 0.5% Cu, balance aluminum) are provided with a shoulder as described extending inwardly from the outer surface and downwardly toward to the lower end of the target member. This resulted in an overlapping step joint 0.100-inches thick and 0.100-inches deep. The backing member was formed by machining commercially available 2014-T6 extruded, aluminum seamless tubing. Prior to welding the target member and backing member were machined such that they had a 0.005-inch (maximum) pressed fit at the shoulder and lip. The target member and backing member were held firmly in place by spot welding at a plurality of places, e.g., four places, with an electron beam prior to the final electron beam welding operation. The components were electron beam welded with full penetration from the exterior.

To evaluate the electron beam welded joints, the target assemblies were visually inspected and helium leak inspected for weld integrity. Shrinkage and distortion were also measured. The radial, i.e., diametral, shrinkage was in the range of 0.002–0.003-inches and the depth shrinkage was in the range of 0.002–0.005-inches. Thus, distortion was minimal.

All aluminum electron beam welded target assemblies, that is, target assemblies with target members and backing members made of material selected from the group of aluminum and aluminum alloys, of the design described produced by the foregoing method has been found to have the ability to withstand high water pressure and high sputter power levels. The method of the invention may also be used to produce target assemblies of other materials, such as target assemblies with target members and backing plates comprising: copper and copper alloys, titanium and titanium alloys or other metals where the target member and backing member are comprised of the same major constituent.

We claim:

1. A method of manufacturing a sputtering target assembly having a target member and a backing member capable of producing an assembly wherein during manufacture distortion of the sputtering target assembly is not greater than about 0.003-inches in the lateral direction and not greater than about 0.005-inches in the transverse direction, comprising:

providing a target member having an upper lateral target surface, a lower end and a side wall with an inner surface and an outer surface;

providing a backing member for the target member, said backing member having a top surface and a side wall with inner and outer surfaces, the top surface of the backing member being adapted to engage the lower end of the target member;

providing a shoulder in the outer surface of the side wall of the target member that extends inwardly and downwardly from the outer surface at the lower end of the target member and terminates in a lip, one side of the lip being at the inner surface;

positioning the top surface of the backing member within said shoulder of the target member so that said top surface is in surface-to-surface contact with the target member and the inner surface is in surface-to-surface contact with the lip, said side wall of said backing member being sized with respect to said shoulder so that the outer surface of the side wall of the backing member is substantially coextensive with the outer surface of the side wall of target member;

firmly holding the target and backing members together and electron beam welding the surface-to-surface contact areas of said target and backing members; and machining the inner surface of the side wall of the backing member and the lip of the target member to remove the lip and provide a coextensive inner surface along the inner surfaces of the backing member and target member.

2. A method according to claim 1 further comprising machining the outer surface of the side walls of the target and backing member to provide a coextensive outer surface.

3. A method according to claim 1 wherein said target and backing member are firmly held together for electron beam welding by electron beam spot welding prior to final electron beam welding of the surface-to-surface contact areas.

4. A method according to claim 1 wherein said target and backing member comprise metals having the same major constituent.

5. A target assembly made according to the method of claim 4.

6. A method according to claim 1 wherein said target and backing members comprise material selected from the group consisting of aluminum and aluminum alloys, copper and copper alloys, and titanium and titanium alloys.

7. A method according to claim 1 wherein said target and backing members comprise a material from the group consisting of aluminum and aluminum alloys.

8. A target assembly made according to the method of claim 7 capable of withstanding water pressure of 60 psi and sputter power levels of greater than 12 kw.

9. A target assembly made according to the method of claim 1.

* * * * *

UNITED STATES PATENT AND TRADEMARK OFFICE
CERTIFICATE OF CORRECTION

PATENT NO. : 5,143,590

DATED : September 1, 1992

INVENTOR(S) : Susan D. Strothers; Robert G. Delano; Garold L. Steed

It is certified that error appears in the above-identified patent and that said Letters Patent is hereby corrected as shown below:

Abstract, line 2, after "assembly" delete "is".

Column 1, line 53, after "however" insert a comma.
Column 1, line 53, after "appears" delete "that is".

Column 2, line 22, change "accompanying" to -- accompanied --.
Column 2, line 24, change "effected" to -- affected --.

Column 4, line 18, change "targets" to -- target --.
Column 4, line 22, before "the lower" delete "to".
Column 4, lines 23,24, change "inches" to -- inch -- (both occurrences).
Column 4, lines 39,40, change "inches" to -- inch -- (both occurrences).

UNITED STATES PATENT AND TRADEMARK OFFICE
CERTIFICATE OF CORRECTION

PATENT NO. : 5,143,590

DATED : September 1, 1992

INVENTOR(S) : Susan D. Strothers; Robert G. Delano; Garold L. Steed

It is certified that error appears in the above-identified patent and that said Letters Patent is hereby corrected as shown below:

In the Claims:

Column 4, lines 60,61, change "inches" to -- inch -- (both occurences).

Column 5, line 18, before "target" insert -- the --.

Signed and Sealed this

Seventh Day of December, 1993

Attest:

BRUCE LEHMAN

Attesting Officer

Commissioner of Patents and Trademarks